(12) United States Patent
Katayama

(10) Patent No.: US 9,953,707 B2
(45) Date of Patent: Apr. 24, 2018

(54) MEMORY DEVICE

(71) Applicant: TOSHIBA MEMORY CORPORATION, Minato-ku, Tokyo (JP)

(72) Inventor: Akira Katayama, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/257,313

(22) Filed: Sep. 6, 2016

(65) Prior Publication Data

US 2016/0379708 A1  Dec. 29, 2016

Related U.S. Application Data

(63) Continuation of application No. PCT/JP2014/069985, filed on Jul. 23, 2014.

(60) Provisional application No. 61/949,896, filed on Mar. 7, 2014.

(51) Int. Cl.
| | |
|---|---|
| *G11C 11/00* | (2006.01) |
| *G11C 13/00* | (2006.01) |
| *G11C 7/06* | (2006.01) |
| *G11C 11/16* | (2006.01) |
| *G11C 7/04* | (2006.01) |
| *G11C 7/14* | (2006.01) |
| *G11C 7/18* | (2006.01) |

(52) U.S. Cl.
CPC ............ *G11C 13/004* (2013.01); *G11C 7/065* (2013.01); *G11C 11/1655* (2013.01); *G11C 11/1657* (2013.01); *G11C 11/1673* (2013.01); *G11C 11/1675* (2013.01); *G11C 13/0026* (2013.01); *G11C 13/0028* (2013.01); *G11C 13/0069* (2013.01); *G11C 7/04* (2013.01); *G11C 7/14* (2013.01); *G11C 7/18* (2013.01); *G11C 13/0004* (2013.01); *G11C 2013/0054* (2013.01); *G11C 2213/79* (2013.01)

(58) Field of Classification Search
CPC ............ G11C 13/0023; G11C 13/0069; G11C 13/004; G11C 13/0004; G11C 13/0038
See application file for complete search history.

(56) References Cited

U.S. PATENT DOCUMENTS

| | | | |
|---|---|---|---|
| 7,649,792 B2 | 1/2010 | Ueda et al. | |
| 7,733,728 B2 | 6/2010 | Sudo | |
| 2006/0050548 A1* | 3/2006 | Oh | ........................ G11C 7/12 365/148 |

(Continued)

OTHER PUBLICATIONS

International Preliminary Report on Patentability (IPRP) including Written Opinion (in English) dated Sep. 22, 2016, issued in counterpart International Application No. PCT/JP2014/069985.

(Continued)

*Primary Examiner* — Uyen B Tran
(74) *Attorney, Agent, or Firm* — Holtz, Holtz & Volek PC

(57) ABSTRACT

According to one embodiment, a memory device includes a sense amplifier including a first input node and a second input node, a first path including a memory cell to be selectively connected to the first input node, and a second path including a reference cell to be selectively connected to the second input node, and is configured to change an input value at the second input node in accordance with the state of the memory cell.

9 Claims, 10 Drawing Sheets

(56) References Cited

U.S. PATENT DOCUMENTS

| | | | |
|---|---|---|---|
| 2009/0268509 A1* | 10/2009 | Maejima | G11C 5/02 |
| | | | 365/148 |
| 2010/0097833 A1 | 4/2010 | Kang et al. | |
| 2010/0188894 A1 | 7/2010 | Rao et al. | |
| 2011/0069554 A1 | 3/2011 | Lo Giudice et al. | |
| 2011/0080775 A1 | 4/2011 | Bae et al. | |
| 2011/0080790 A1 | 4/2011 | Tran et al. | |
| 2012/0300566 A1 | 11/2012 | Mueller et al. | |
| 2013/0028014 A1 | 1/2013 | Guo et al. | |
| 2014/0063962 A1 | 3/2014 | Sakurai | |
| 2014/0104933 A1* | 4/2014 | Yamahira | G11C 7/04 |
| | | | 365/148 |

OTHER PUBLICATIONS

Taiwanese Office Action (and English translation thereof) dated Dec. 24, 2015, issued in counterpart Taiwanese Application No. 103126265.

International Search Report (ISR) and Written Opinion dated Sep. 9, 2014 issued in International Application No. PCT/JP2014/069985.

* cited by examiner

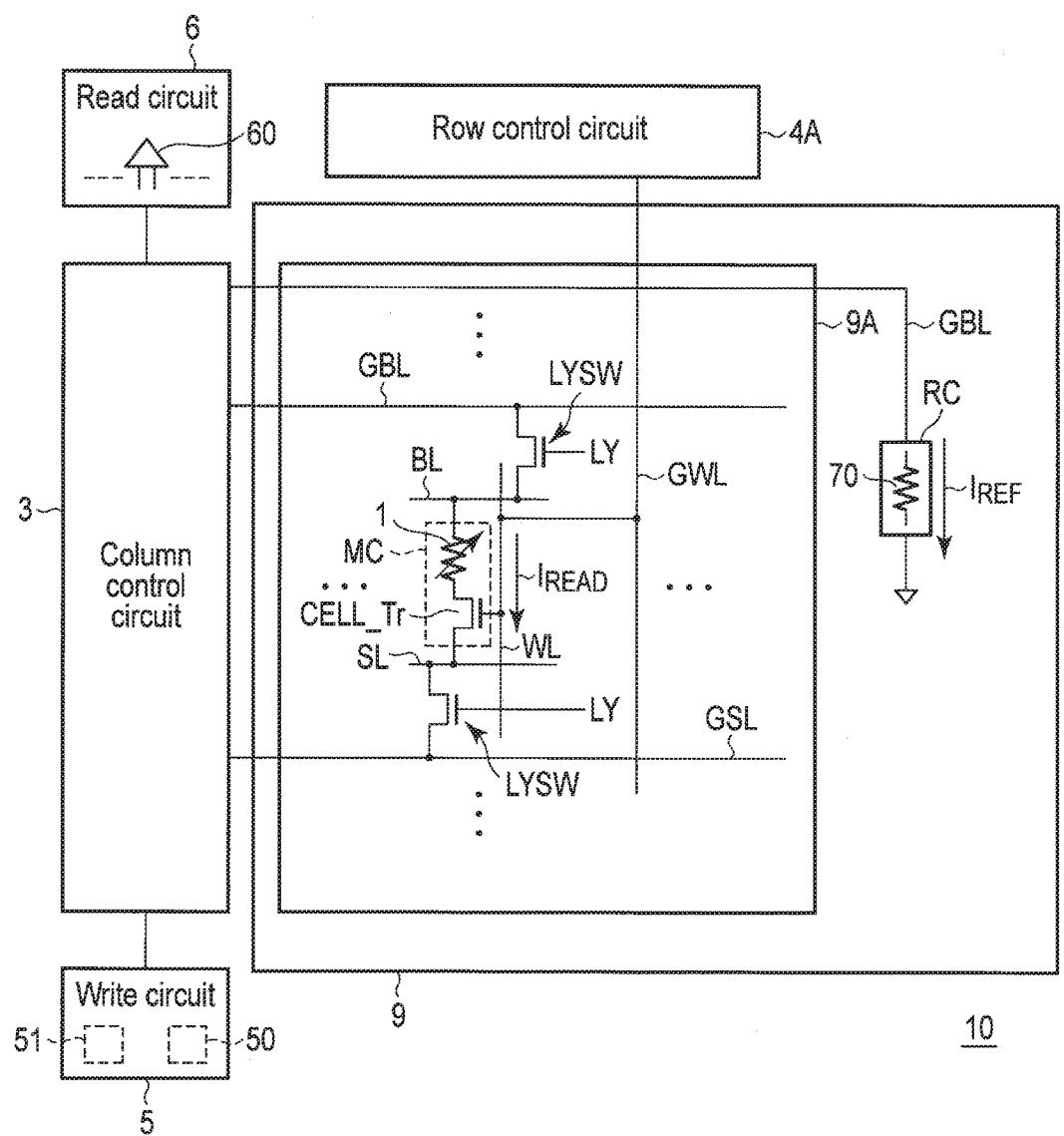
F I G. 1

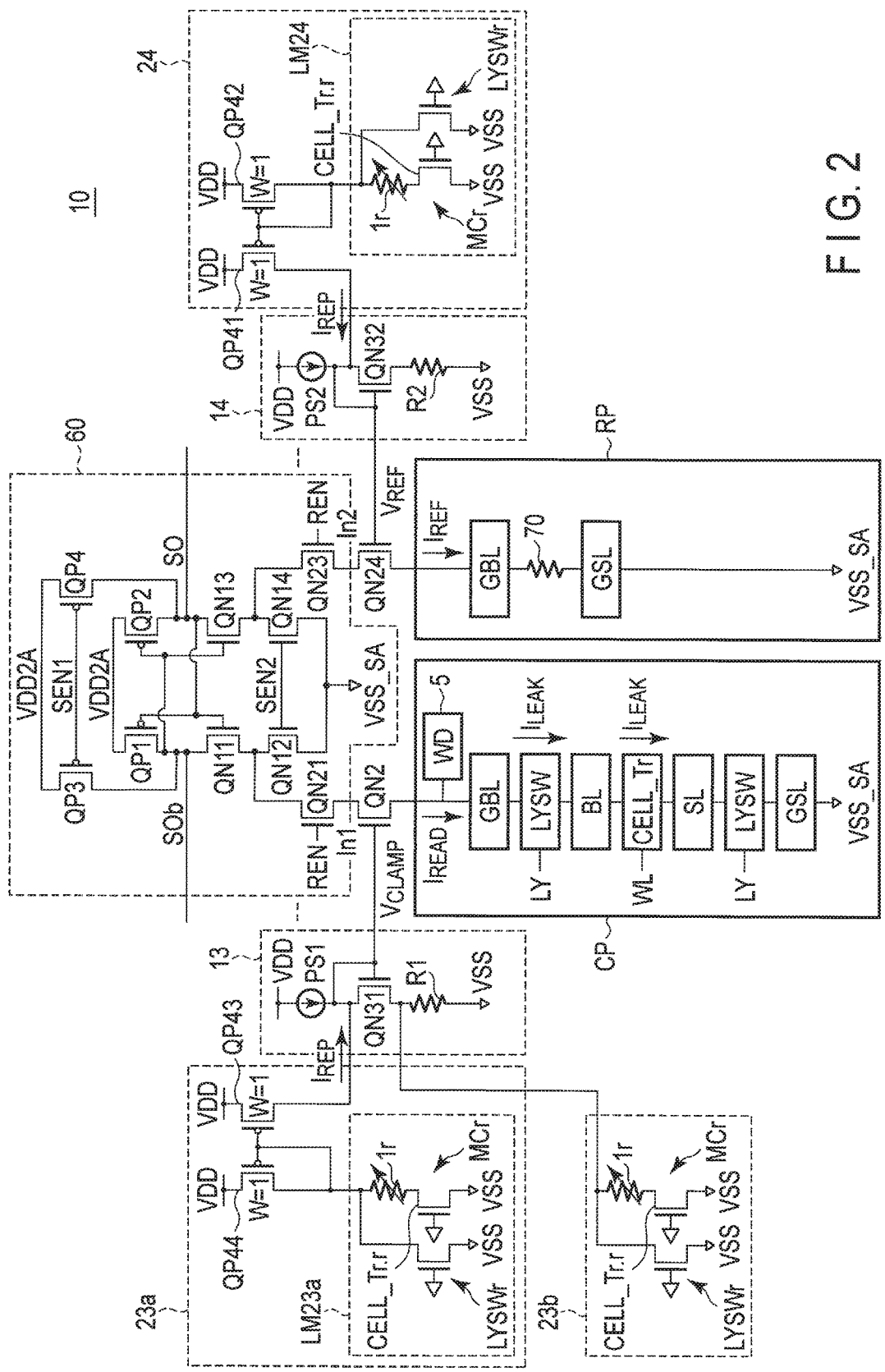
F I G. 2

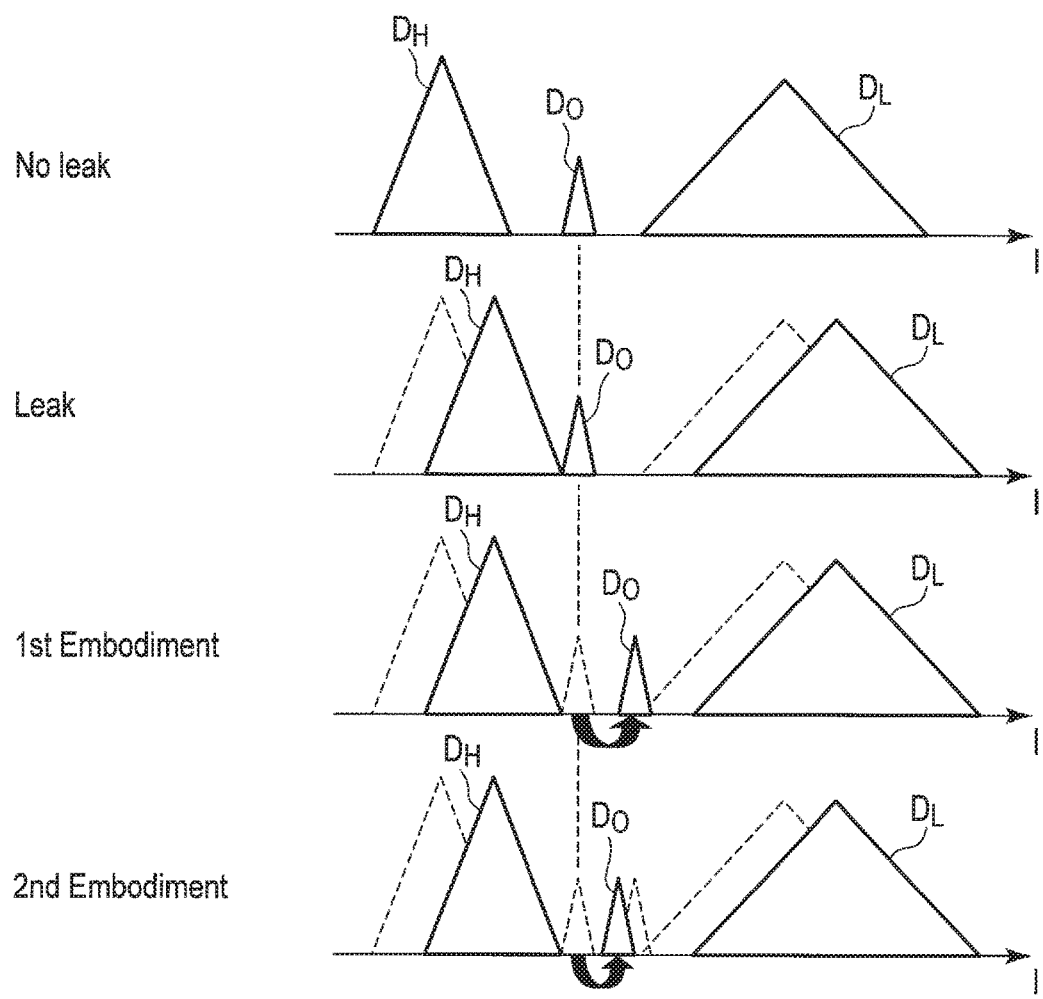
F I G. 11

MEMORY DEVICE

CROSS REFERENCE TO RELATED APPLICATIONS

This application is a Continuation application of PCT Application No. PCT/JP2014/069985, filed Jul. 23, 2014 and based upon and claiming the benefit of priority from U.S. Provisional Application No. 61/949,896, filed Mar. 7, 2014, the entire contents of all of which are incorporated herein by reference.

FIELD

Embodiments described herein relate generally to a memory device.

BACKGROUND

There exists a memory device using a resistance change memory element. Such memory device using the resistance change memory element needs to read and write data reliably.

BRIEF DESCRIPTION OF THE DRAWINGS

FIG. 1 is a block diagram schematically showing an example of the configuration of a memory device according to the first embodiment;

FIG. 2 is a block diagram schematically showing an example of the configuration of circuits on the read current path of the memory device according to the first embodiment;

FIG. 11 shows schematic graphs each illustrating the relationship between a read current and a reference current when a memory cell includes a resistance change memory element.

DETAILED DESCRIPTION

Figure 3:
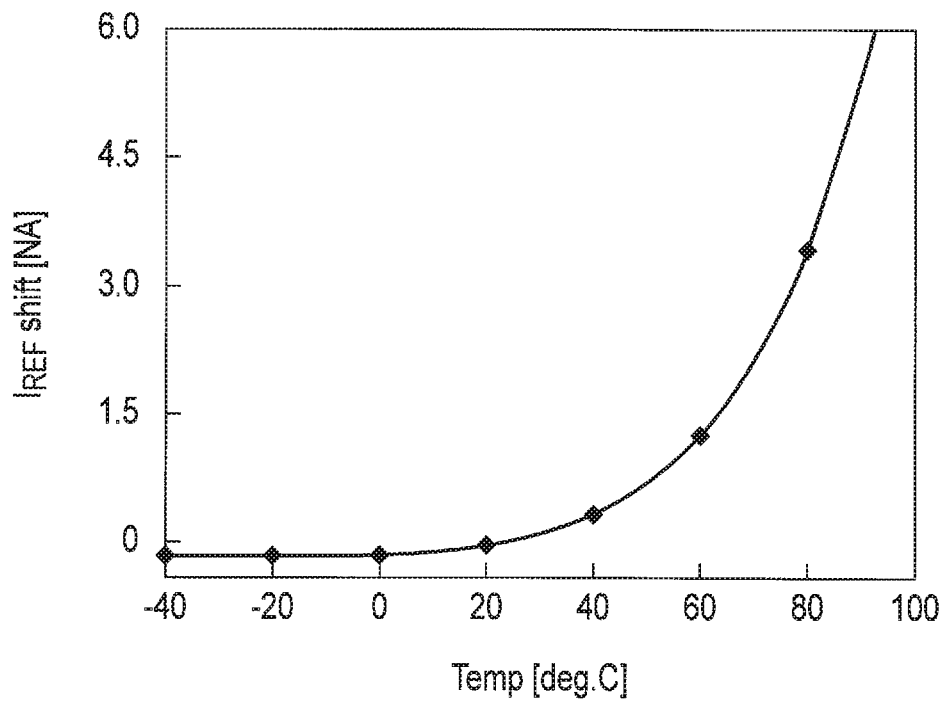
FIG. 3 is a graph showing an example of the cell transistor temperature dependence of a reference current generated in the memory device according to the first embodiment.

In general, according to one embodiment, a memory device includes a sense amplifier, a first path, a second path. The sense amplifier includes a first input node and a second input node and is configured to output a signal based on a difference between input values at the first input node and the second input node. The first path includes a memory cell to be selectively connected to the first input node and is provided between the first input node and a ground node. The second path includes a reference cell to be selectively connected to the second input node and is provided between the second input node and the ground node. The input value at the second input node of the sense amplifier is changed such that a change amount of the input value between two different temperatures T2 and (T2+ΔT) in a second temperature region, at a temperature higher than in a first temperature region, of the memory cell becomes larger than the change amount of the input value between two different temperatures T1 and (T1+ΔT) in the first temperature region of the memory cell, where ΔT is an increase amount of the temperature.

There exists a memory device including a memory cell using a resistance change memory element or the like. Such a memory device includes, for example, a plurality of memory cells. To read data from a specific memory cell, for example, the difference between a current value output from the target memory cell and a current value output from a reference cell as a determination criterion is compared. Since the current value of a memory cell with respect to the current value of a reference cell changes depending on the difference in data held by individual memory cells, data held by the memory cells can be discriminated.

However, a leak current may be generated in a memory cell other than the read target. Especially when a memory cell is in a high temperature state or the like, the leak current is readily generated. The generated leak current is added to, for example, the current value from the read target memory cell, and makes the apparent output value from the memory cell larger than the actual one. Since the difference between the apparent current value of the memory cell and the current value of the reference cell thus becomes small, it may be impossible to correctly read data.

According to the embodiments described below, a memory device of improved data read reliability can be obtained. More specifically, the memory device according to an embodiment includes a sense amplifier including a first input node and a second input node and configured to output a signal based on the difference between input values at the first input node and the second input node, a first path including a memory cell to be selectively connected to the first input node and provided between the first input node and a ground node, and a second path including a reference cell to be selectively connected to the second input node and provided between the second input node and the ground node. The input value at the second input node of the sense amplifier is changed such that the change amount of the input value between two different temperatures T2 and (T2+ΔT) in a second temperature region, at a temperature higher than in a first temperature region, of the memory cell becomes larger than the change amount of the input value between two different temperatures T1 and (T1+ΔT) in the first temperature region of the memory cell, where ΔT is the increase amount of the temperature.

The embodiments will now be described with reference to the accompanying drawings. The same reference numerals denote the same parts throughout the drawings. A repetitive description will be given as needed.

First Embodiment

A memory device according to this embodiment will be described below with reference to FIGS. 1, 2, 3, 4, 11, and 12.

(1) Example of Configuration of Memory Device

An example of the configuration of a memory device according to this embodiment will be described first with reference to FIG. 1. FIG. 1 is a block diagram schematically showing an example of the configuration of a memory device 10 according to this embodiment.

[Core Region]

As shown FIG. 1, the memory device 10 according to this embodiment includes one or more cell arrays 9. The cell array 9 constitutes the core region of the memory device 10, and includes a memory cell array 9A and one or more reference cells RC.

The memory cell array 9A includes a plurality of memory cells MC.

A global bit line GBL, a bit line BL, a global source line GSL, a source line SL, a global word line GWL, and a word line WL are provided in the memory cell array 9A. The global bit line GBL, the bit line BL, the global source line GSL, and the source line SL extend in the X direction (column direction). The global word line GWL and the word line WL extend in the Y direction (row direction). The plurality of memory cells MC are arranged in a matrix in the memory cell array 9A and provided so as to be connected to the lines GBL, BL, GSL, SL, GWL, and WL.

More specifically, the plurality of memory cells MC arrayed in the X direction are connected to a common pair of bit line BL and source line SL. The bit line BL and the source line SL to which the memory cells MC are connected are connected to the global bit line GBL and the global source line GSL, respectively, via local column switches LYSW. The local column switch LYSW is a field effect transistor such as an n-type MOSFET (Metal Oxide Semiconductor Field Effect Transistor). When a signal LY of high level is supplied to the gates of specific local column switches LYSW, the local column switches LYSW are turned on, and the memory cell MC corresponding to them is selected. The plurality of memory cells MC arrayed in the Y direction are connected to a common word line WL. The word line WL to which the memory cells MC are connected is connected to the global word line GWL.

The memory cell MC includes, for example, one memory element 1 and one cell transistor CELL_Tr. In the memory device 10 according to this embodiment, for example, a resistance change memory element is used as the memory element 1. The resistance state of the resistance change memory element changes when a current, voltage, or energy (for example, heat) equal to or more than a certain threshold is given. More specifically, the resistance change memory element changes to a high resistance state or a low resistance state in accordance with data to be stored. Hence, when, for example, reading data, the output current value or potential changes in accordance with the magnitude of the resistance value of the resistance change memory element to which a read current $I_{READ}$ is supplied. Data stored in the resistance change memory element is discriminated based on a change amount (read signal or read output) according to the magnitude of the resistance value. As the resistance change memory element, for example, a magnetoresistive element is used. The cell transistor CELL_Tr is a field effect transistor such as an n-type MOSFET. When the cell transistor CELL_Tr is turned on, the memory element 1 corresponding to it is connected between the bit line BL and the source line SL, which are formed in pairs.

In the cell array 9, one or more reference cells RC are connected to the global bit line GBL for the reference cells RC.

The reference cell RC generates a reference current $I_{REF}$ as a data read determination criterion (read level) with respect to the amount of the change in the current/potential caused by the resistance value of the memory element 1 provided in the memory cell MC. The reference current $I_{REF}$ is generated by, for example, supplying a current to a resistor having a resistance value of an intermediate magnitude (to be also referred to as an intermediate resistance value hereinafter) between the resistance value of the memory element 1 in a high resistance state and the resistance value of the memory element 1 in a low resistance state. The reference cell RC includes one or more resistive elements 70 configured to generate the intermediate resistance value.

[Peripheral Region]

Peripheral circuits such as a row control circuit 4A, a column control circuit 3, a write circuit 5, and a read circuit 6 are provided in the peripheral region of the cell array 9.

The row control circuit 4A is connected to one end of the global word line GWL extending from the cell array 9. The row control circuit 4A controls activation/deactivation of the individual word lines WL via the global word line GWL based on an external address signal.

The column control circuit 3 is connected to the global bit line GBL and the global source line GSL extending from the cell array 9. The column control circuit 3 controls connection of the individual bit lines BL and source lines SL to the write circuit 5 and the read circuit 6 based on an external address signal. The individual bit lines BL and source lines SL are connected to the write circuit 5 and the read circuit 6 via the global bit line GBL and the global source line GSL and the local column switches LYSW.

The write circuit 5 is connected to the individual bit lines BL and source lines SL, which are formed in pairs, via the column control circuit 3. The write circuit 5 includes a source circuit 50 such as a current source or voltage source for generating a write pulse such as a write current or write voltage, and a sink circuit 51 that absorbs the write pulse. At the time of data write, the write circuit 5 supplies the write pulse to an externally selected specific memory cell MC. For example, if the memory element 1 provided in the memory cell MC is a resistance change memory element, the resistance state (resistance value) of the memory element 1 in the selected memory cell MC changes when the write pulse is supplied.

The read circuit 6 is connected to the one-end sides of the individual bit lines BL and source lines SL, which are formed in pairs, via the column control circuit 3. The read circuit 6 includes a voltage source or current source for generating the read current $I_{READ}$, a sense amplifier 60 that detects and amplifies a read signal, and a latch circuit that temporarily holds data. The read circuit 6 detects the current value of the read current $I_{READ}$ or the potential of the bit line BL and compares it with the reference current $I_{REF}$ generated by the reference cell RC, thereby reading data stored in the memory cell MC.

(2) Example of Configuration of Circuits on Read Path

An example of the configuration of circuits on the read path around the sense amplifier 60 of the memory device 10 will be described next with reference to FIG. 2. FIG. 2 is a block diagram schematically showing an example of the configuration of circuits on the read path of the memory device according to this embodiment.

As shown in FIG. 2, the read path of the memory device 10 includes the sense amplifier 60, a read current path CP serving as a first path, a reference current path RP serving as a second path, a constant current generation circuit 13 serving as a current generation circuit configured to generate a clamp potential used to adjust the potential on the read current path CP, and a constant current generation circuit 14 serving as a reference current generation circuit configured to generate a clamp potential used to adjust the potential on the reference current path RP.

[Sense Amplifier and Constant Current Generation Circuits]

The sense amplifier 60 and the constant current generation circuits 13 and 14 will be described below in detail. As described above, these circuits are located in the peripheral region of the memory device 10.

The sense amplifier 60 includes an input node In1 serving as a first input node and an input node In2 serving as a second input node, and outputs signals SO and SOb based on the difference between the input values of the input nodes In1 and In2. The last "b" of the signal SOb indicates the inverted logic of the element.

As shown in FIG. 2, the sense amplifier 60 includes a transistor QP1 that is a p-type MOSFET or the like and transistors QN11 and QN12 that are n-type MOSFETs or the like, which are connected in series between a ground node VSS_SA and a node (power supply node) VDD2A having a power supply potential. The sense amplifier 60 also includes a transistor QP2 that is a p-type MOSFET or the like and transistors QN13 and QN14 that are n-type MOSFETs or the like, which are connected in series between the node VDD2A and the ground node VSS_SA.

The connection node between the transistors QP1 and QN11 outputs the signal SOb. The output node SOb that outputs the signal SOb is connected to the gates of the transistors QP2 and QN13. The connection node between the transistors QP2 and QN13 outputs the signal SO. The output node SO that outputs the signal SO is connected to the gates of the transistors QP1 and QN11. The gate of the transistor QN12 is connected to the gate of the transistor QN14 (SEN2).

The output nodes SOb and SO are connected to the node VDD2A via transistors QP3 and QP4 that are p-type MOSFETs or the like, respectively. The gate of the transistor QP3 is connected to the gate of the transistor QP4 (SEN1).

The sense amplifier 60 further includes transistors QN21 and QN23 that are n-type MOSFETs or the like. The drain of the transistor QN21 is connected to the connection node between the transistor QN11 and the transistor QN12, and the source of the transistor QN21 forms the input node In1 of the sense amplifier 60. The drain of the transistor QN23 is connected to the connection node between the transistor QN13 and the transistor QN14, and the source of the transistor QN23 forms the input node In2 of the sense amplifier 60. When signals REN of high level are supplied to the gates of the transistors QN21 and QN23, the sense amplifier 60 is enabled.

The input node In1 of the sense amplifier 60 is connected to the drain of a transistor QN2 that is an n-type MOSFET or the like. The source of the transistor QN2 is connected to the global bit line GBL on the cell side. The gate of the transistor QN2 receives a potential $V_{CLAMP}$. The voltage of the source of the transistor QN2 is clamped to a specific value by the transistor QN2 and the potential $V_{CLAMP}$. The potential $V_{CLAMP}$ is supplied from the constant current generation circuit 13. The constant current generation circuit 13 includes a constant current source PS1, a transistor QN31 that is an n-type MOSFET or the like, and a resistor R1, which are connected in series between a node VDD and a ground node VSS. The gate of the transistor QN31 is connected to the drain of its own and the gate of the transistor QN2.

The input node In2 of the sense amplifier 60 is connected to the drain of a transistor QN24 that is an n-type MOSFET or the like. The source of the transistor QN24 is connected to the global bit line GBL on the reference side. The gate of the transistor QN24 receives a potential $V_{REF}$. The voltage of the source of the transistor QN24 is clamped to a specific value by the transistor QN24 and the potential $V_{REF}$. The potential $V_{REF}$ is supplied from the constant current generation circuit 14. The constant current generation circuit 14 includes a constant current source PS2, a transistor QN32 that is an n-type MOSFET or the like, and a resistor R2, which are connected in series between the node VDD and the ground node VSS. The gate of the transistor QN32 is connected to the drain of its own and the gate of the transistor QN24. The constant current generation circuit 14 may be included in the constant current generation circuit 13.

[Read Current Path and Reference Current Path]

The read current path CP and the reference current path RP will be described below in detail. They are located in the core region of the memory device 10.

The read current path CP serving as the first path includes the memory cell MC to be selectively connected to the input node In1 of the sense amplifier 60 and is provided between the input node In1 and the ground node VSS_SA.

More specifically, when reading data, the local column switch LYSW of the column to which the read target memory cell MC belongs is turned on by the signal LY of high level. In addition, the word line WL connected to the read target memory cell MC is changed to high level to turn on the cell transistor CELL_Tr of the read target memory cell MC. The read target memory cell MC is thus connected between the global source line GSL and the global bit line GBL. As a result, the read current path CP including the selected memory cell MC is formed between the input node In1 and the ground node VSS_SA. As described above, the read current path CP includes one set of circuits that can be included between the ground node VSS_SA and the input node In1 of the sense amplifier 60.

More specifically, the read current path CP mainly includes one set of the global bit line GBL to which the write circuit 5 is connected, the local column switch LYSW, the bit line BL, the cell transistor CELL_Tr provided in the memory cell MC, the source line SL, the local column switch LYSW, and the global source line GSL.

The reference current path RP serving as the second path includes the reference cell RC to be selectively connected to the input node In2 of the sense amplifier 60 and is provided between the input node In2 and the ground node VSS_SA. More specifically, the reference current path RP mainly includes one set of the global bit line GBL, the resistive element 70 provided in the reference cell RC, and the global source line GSL.

When reading data, the sense amplifier 60 is enabled. As a consequence, the read current $I_{READ}$ corresponding to the resistance state of the read target memory cell MC flows through the read current path CP, and the reference current $I_{REF}$ flows through the reference current path RP.

The read current $I_{READ}$ that has flowed through the read current path CP is detected as the input value to the sense amplifier 60 at the input node In1. The reference current $I_{REF}$ that has flowed through the reference current path RP is detected as the input value to the sense amplifier 60 at the input node In2. The sense amplifier 60 compares the read current $I_{READ}$ serving as the input value at the input node In1 with the reference current $I_{REF}$ serving as the input value at the input node In2. Based on whether the read current $I_{READ}$ is larger or smaller than the reference current $I_{REF}$, the sense amplifier 60 outputs the corresponding signal SO or SOb. That is, the resistance state of the memory cell MC is discriminated, and data held by the memory cell MC is read. Note that the input values at the input nodes In1 and In2 may be voltages, potentials, or the like.

The read current $I_{READ}$ at the input node In1 ideally has a magnitude corresponding to the data held by the read target memory cell MC. However, in the read current path CP as described above, a leak current $I_{LEAK}$ may flow to, for example, an unselected cell transistor CELL_Tr and/or local column switch LYSW. The magnitude of the leak current $I_{LEAK}$ changes in accordance with the state of the memory cell MC, for example, a high temperature state of the memory cell MC.

More specifically, the state of the memory cell MC is, for example, the temperature state of the cell transistor CELL_Tr. The leak current $I_{LEAK}$ readily flows to the cell transistor CELL_Tr when, for example, the cell transistor CELL_Tr is in a high temperature state. When the cell transistor CELL_Tr has, for example, a low threshold voltage specification so as to enable a high-speed operation, the leak current $I_{LEAK}$ especially becomes large. The state of the memory cell MC may be, for example, the temperature state of the local column switch LYSW. When the local column switch LYSW is in a high temperature state, and in particular, has a high-speed operation specification, the leak current $I_{LEAK}$ becomes large.

The leak current $I_{LEAK}$ may be added to the read current $I_{READ}$ flowing via the selected memory cell MC, and the substantial read current $I_{READ}$ in the whole read current path CP may become larger than the ideal value. That is, the input value at the input node In1 may be the sum of the actual read current $I_{READ}$ and the leak current $I_{LEAK}$. As a result, the data read accuracy may lower or data read may be impossible because the read current $I_{READ}$ and the reference current $I_{REF}$ are not correctly compared.

In this embodiment, leak current replica circuits 23*a*, 23*b*, and 24 are provided in the peripheral region of the memory device 10 to change the value of the reference current $I_{REF}$ in accordance with the amount of the leak current $I_{LEAK}$ generated on the cell side.

[Leak Current Replica Circuit]

The leak current replica circuit 24 serving as a replica circuit is connected to the transistor QN32 provided in the constant current generation circuit 14 in parallel with the constant current source PS2 of the constant current generation circuit 14, and generates a replica current $I_{REP}$ corresponding to the leak current $I_{LEAK}$ in the read current path CP.

More specifically, the drain of a transistor QP41 that is a p-type MOSFET or the like provided in the leak current replica circuit 24 is connected to the drain of the transistor QN32. The source of the transistor QP41 is connected to the node VDD. The gate of a transistor QP42 that is a p-type MOSFET or the like is connected to the gate of the transistor QP41.

A leak monitor circuit LM24 is connected to the drain of the transistor QP42. The leak monitor circuit LM24 has a configuration in which a replica MCr of the memory cell MC and a replica LYSWr of the local column switch LYSW are connected in parallel.

The transistor QP42 and the replica MCr are connected in series between the node VDD and the ground node VSS. The transistor QP42 and the replica LYSWr are connected in series between the node VDD and the ground node VSS. The drain of the transistor QP42 is also connected to the connection node between the transistor QP41 and the transistor QP42.

The replica MCr includes, for example, a replica 1*r* of the memory element 1 and a replica CELL_Tr.r of the cell transistor CELL_Tr. The replica 1*r* is formed from, for example, a memory element of the same type as the memory element 1, for example, a resistance change memory element, and configured to exhibit the same behavior as the memory element 1. More specifically, the replica 1*r* has substantially the same structure and is formed substantially in the same process steps as the memory element 1. In other words, the replica 1*r* includes, for example, one of a plurality of structures formed as the memory elements 1.

The replica CELL_Tr.r is formed from a field effect transistor such as an n-type MOSFET, like, for example, the cell transistor CELL_Tr, and configured to exhibit the same behavior as the cell transistor CELL_Tr. The gate of the replica CELL_Tr.r is connected to, for example, the ground node VSS. More specifically, the replica CELL_Tr.r has substantially the same structure and is formed substantially in the same process steps as the cell transistor CELL_Tr. In other words, the replica CELL_Tr.r includes, for example, one of a plurality of structures formed as the cell transistors CELL_Tr.

The replica LYSWr is formed from a field effect transistor such as an n-type MOSFET, like, for example, the local column switch LYSW, and configured to exhibit the same behavior as the local column switch LYSW. The gate of the replica LYSWr is connected to, for example, the ground node VSS. More specifically, the replica LYSWr has substantially the same structure and is formed substantially in the same process steps as the local column switch LYSW. In other words, the replica LYSWr includes, for example, one of a plurality of structures formed as the local column switches LYSW.

With these structures, the leak current replica circuit 24 generates the replica current $I_{REF}$ corresponding to the leak current $I_{LEAK}$ generated on the cell side. More specifically, the leak current replica circuit 24 is constituted as a 1:1 current mirror circuit that returns the output on the side of the transistor QP42 to the side of the transistor QP41 at 1:1. That is, the transistors QP41 and QP42 have the same gate width W and, by extension, the same power driving capability. At the output on the side of the transistor QP42, the leak current replica circuit 24 causes the leak monitor circuit LM24 to generate a current having substantially the same magnitude as the leak current $I_{LEAK}$. At the output on the side of the transistor QP41, the leak current replica circuit 24 generates the replica current $I_{REP}$ having substantially the same magnitude as the output on the side of the transistor QP42.

When the leak current replica circuit 24 is connected to the constant current generation circuit 14, a potential having a magnitude corresponding to the replica current $I_{REP}$ is added to the potential $V_{REF}$. In addition, the reference current $I_{REF}$ corresponding to the potential $V_{REF}$ is detected as the input value to the sense amplifier 60 at the input node In2. That is, since currents having substantially the same magnitude flow to the source sides of the transistors QN24 and QN32 which form a current mirror circuit, the reference current $I_{REF}$ to which the replica current $I_{REP}$ is added becomes the input value to the sense amplifier 60 at the input node In2.

The leak current replica circuit 23a serving as a replica circuit is connected to the transistor QN31 provided in the constant current generation circuit 13 in parallel with the constant current source PS1 of the constant current generation circuit 13, and generates the replica current $I_{REP}$ corresponding to the leak current $I_{LEAK}$ in the read current path CP.

More specifically, the leak current replica circuit 23a has the same configuration as the leak current replica circuit 24. That is, the leak current replica circuit 23a includes transistors QP43 and QP44 that are p-type MOSFETs or the like. The transistors QP43 and QP44 correspond to the transistors QP41 and QP42, respectively. The leak current replica circuit 23a includes a leak monitor circuit LM23a. The leak monitor circuit LM23a corresponds to the leak monitor circuit LM24 and has the same configuration as the leak monitor circuit LM24. That is, the leak monitor circuit LM23a includes the replica MCr including the replica 1r and the replica CELL_Tr.r, and the replica LYSWr. The leak current replica circuit 23a is also constituted as a 1:1 current mirror circuit that returns the output on the side of the transistor QP44 to the side of the transistor QP43 at 1:1.

The present inventors found that not all the leak current $I_{LEAK}$ generated in the read current path CP is reflected on the constant current source PS1 of the constant current generation circuit 13. Hence, when the replica current $I_{REP}$ generated by the leak current replica circuit 24 on the reference side is directly added to the reference current $I_{REF}$, the reference current $I_{REF}$ may excessively shift. According to the present inventors, when the leak current replica circuit 23a is connected to the constant current generation circuit 13, the replica current $I_{REP}$ corresponding to the leak current $I_{LEAK}$ generated on the cell side is added to the constant current generation circuit 13. That is, the leak current replica circuit 23a can compensate for the voltage of the constant current generation circuit 13 and attain a balance with the replica current $I_{REP}$ added to the reference side.

The leak current replica circuit 23b serving as a leak monitor circuit is connected to the source of the transistor QN31 provided in the constant current generation circuit 13, and corrects the source voltage of the transistor QN31.

More specifically, the leak current replica circuit 23b has the same configuration as the leak monitor circuits LM23 and LM24. That is, the leak current replica circuit 23b has a configuration in which the replica MCr including the replica 1r and the replica CELL_Tr.r and the replica LYSWr are connected in series with the transistor QN31. The replica MCr and the replica LYSWr are connected in parallel with each other and connected to the ground node VSS.

Currents having substantially the same magnitude flow to the source sides of the transistors QN2 and QN31 that form a current mirror circuit. When the leak current replica circuit 23b that is the replica of the read current path CP is added to the source side of the transistor QN31, the resistance values on the source sides of the transistors QN2 and QN31 can have almost the same magnitude. It is therefore possible to more reliably equalize the magnitudes of the currents on the source sides of the transistors QN2 and QN31.

Note that the memory device 10 according to this embodiment need not always include the leak current replica circuit 23a. Voltage compensation of the constant current generation circuit 13 need not always be done in the memory device 10. The memory device 10 according to this embodiment need not always include the leak current replica circuit 23b. Source voltage correction of the two transistors QN2 and QN31 need not always be done in the memory device 10.

Note that generating a current having substantially the same magnitude as the leak current $I_{LEAK}$ by the leak monitor circuit LM23 or LM24 can also be referred to as monitoring of the leak current $I_{LEAK}$ in the read current path CP by the leak monitor circuit LM23 or LM24.

(3) Effects of this Embodiment

According to this embodiment, one or a plurality of effects to be described below can be obtained.

(A) According to this embodiment, the input value at the input node In2, that is, the reference current $I_{REF}$ is configured to change in accordance with the state of the cell transistor CELL_Tr and/or local column switch LYSW. This can improve the data read reliability of the memory device 10.

Figure 12:
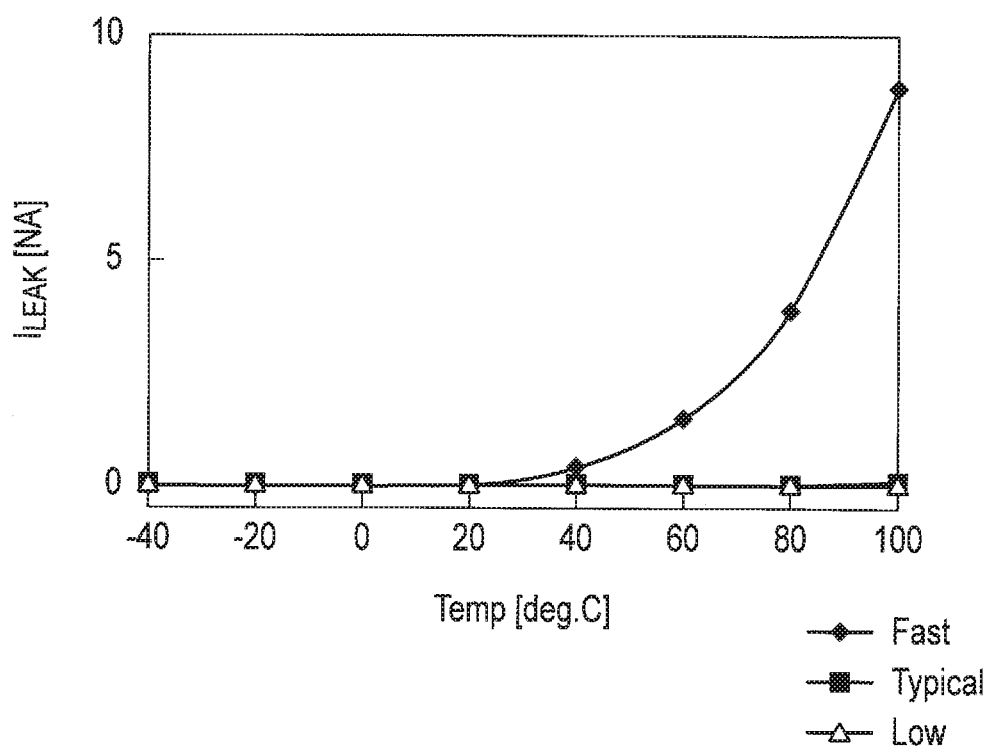
FIG. 12 is a graph showing an example of the cell transistor temperature dependence of a leak current flowing to the memory device according to the comparative example.

As described above, the cell transistor CELL_Tr or the like may change to, for example, a high temperature state. The cell transistor CELL_Tr or the like may have a high-speed operation specification. The high-speed operation specification is implemented by designing the cell transistor CELL_Tr or the like to have, for example, a low threshold voltage. In particular, the temperature state of the cell transistor CELL_Tr or the like of the high-speed operation specification affects the leak current $I_{LEAK}$ flowing to the cell transistor CELL_Tr or the like. FIG. 12 shows an example of the cell transistor temperature dependence of a leak current generated on the cell side. The abscissa of the graph represents the temperature in degrees Celsius (deg. C.) of a memory cell, and the ordinate of the graph represents the leak current value (NA: arbitrary unit) in a cell transistor. As shown in FIG. 12, the leak current value in a cell transistor of high-speed operation specification (♦ in the graph) abruptly increases in the high temperature state as compared to cell transistors of a normal operation specification and low-speed operation specification (■ and Δ in the graph). That is, the gradient of the graph abruptly changes between a low temperature region serving as a first temperature region of a temperature lower than a specific temperature (near room temperature in the example of the graph of FIG. 12) and a high temperature region serving as a second temperature region of a temperature higher than the specific temperature. The leak current per global bit line further increases as the number of bit lines in the cell array or the number of memory cells connected to one bit line increases.

Hence, in a memory device according to a comparative example in which, for example, the reference current does not change, if a cell transistor of high-speed operation specification is in a high temperature state, the substantial read current increases, and a read error may occur, as indicated by, for example, the second graph (Leak) of FIG. 11. FIG. 11 shows schematic graphs each illustrating the relationship between a read current and a reference current when a memory cell includes a resistance change memory element. The abscissa of FIG. 11 represents a current value, and the ordinate represents the probability of existence of resistance change memory elements and reference cells, number of elements, that exhibit a certain current value.

The uppermost graph (No leak) of FIG. 11 shows a case when no leak current is generated on the cell side. At this time, a distribution Do of reference currents generated by reference cells is located at, for example, the intermediate position between a distribution $D_H$ of read currents flowing to memory cells in a high resistance state and a distribution $D_L$ of read currents flowing to memory cells in a low resistance state, as assumed. Hence, the magnitude of the read current can be compared with respect to the reference current, and data of a memory cell can be read. In the comparative example in which the reference current is fixed, however, as indicated by the lower graph (Leak), when a leak current is generated on the cell side, for example, the distributions $D_H$ and $D_L$ shift to the high current side, and a region where the distribution $D_H$ overlaps the distribution $D_0$ is formed. In such a region, the magnitude of the read current cannot be compared with respect to the reference current. Hence, the data read accuracy from a memory cell may lower, or data read itself may be impossible.

According to this embodiment, since the reference current $I_{REF}$ changes in accordance with the state of the cell transistor CELL_Tr or the like, as indicated by the additionally lower graph (1st Embodiment) of FIG. 11, the distribution $D_0$ can be shifted in an amount almost equal to, for example, the shift amount of the distributions $D_H$ and $D_L$. It is therefore possible to more stably read data from the memory cell MC.

FIG. 3 shows an example of the cell transistor temperature dependence of the reference current $I_{REF}$ that is changed in accordance with the state of the cell transistor CELL_Tr or the like. The abscissa of the graph represents the temperature in degrees Celsius (deg. C.) of a memory cell, and the ordinate of the graph represents a change amount of the reference current $I_{REF}$, $I_{REF}$ Shift (NA: arbitrary unit). As can be seen from FIG. 3, when the cell transistor CELL_Tr is in a high temperature state, the gradient of the change amount of the reference current $I_{REF}$ abruptly increases, like the behavior of the leak current on the cell side shown in FIG. 12.

That is, according to this embodiment, the input value at the input node In2, that is, the reference current IRE is changed such that the change amount according to the change in the temperature of the cell transistor CELL_Tr or the like in a high temperature state becomes larger than the change amount according to the change in the temperature of the cell transistor CELL_Tr or the like in a low temperature state. More specifically, the reference current $I_{REF}$ is changed such that the change amount of the input value between two different temperatures T2 and (T2+ΔT) in a high temperature region of the memory cell becomes larger than the change amount of the input value between two different temperatures T1 and (T1+ΔT) in a low temperature region of the memory cell, where ΔT is the increase amount of the temperature. This can improve the data read reliability of the memory device 10.

(B) According to this embodiment, the constant current generation circuit 14 provided with the leak current replica circuit 24 that generates the replica current $I_{REP}$ corresponding to the leak current $I_{LEAK}$ in the read current path CP is connected to the input node In2 of the sense amplifier 60. This can improve the data read reliability of the memory device 10.

The data read reliability can be evaluated using, for example, a Z value as an index. The Z value is given by Z value=$(Iu-Icrit)/\sigma$ The larger the Z value for a specific reference current $I_{REF}$ is, the wider the read margin of a memory cell is.

Figure 4:
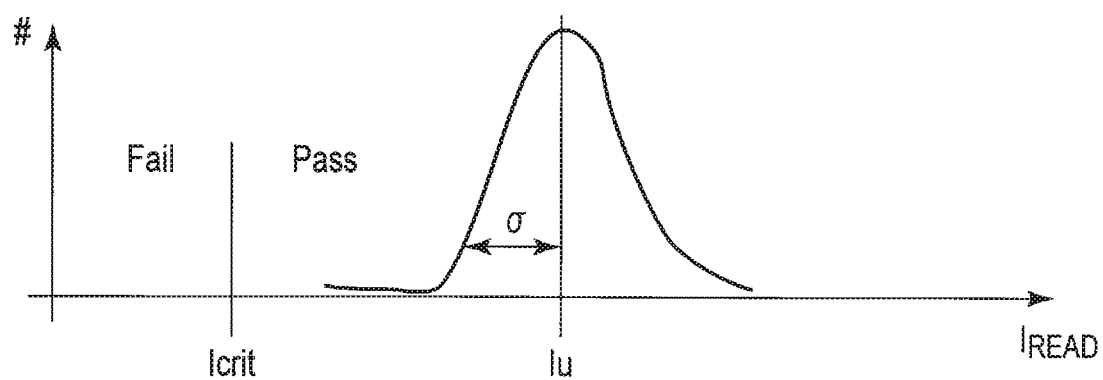
FIG. 4 is a graph for explaining the definition of a Z value.

FIG. 4 is an explanatory view concerning the above equation. The abscissa of FIG. 4 represents a current value, and the ordinate represents the probability of existence of memory elements, number of elements, in the same resistance state for a specific read current value. As shown in FIG. 4, Iu of the above equation is the average value of the read currents $I_{READ}$ flowing to the memory cells MC; σ, the standard deviation of the read currents $I_{READ}$ flowing to the memory cells MC; and Icrit, the lower limit current value that enables data read from the memory cell MC.

If the reference current is fixed, as described above, the Z value defined in the above manner considerably decreases (Z Drop) as the leak current $I_{LEAK}$ is generated. This is because, for example, the read margin of the memory cell cannot sufficiently be ensured, as shown in the graph (Leak) of the comparative example in FIG. 11.

According to this embodiment, the read margin of the memory cell MC can be made wide, and an abrupt decrease in the Z value caused by an increase in the leak current $I_{LEAK}$ can be suppressed. That is, it is possible to maintain a large Z value and ensure the read margin of the memory cell MC.

(C) According to this embodiment, the constant current generation circuit 13 provided with the leak current replica circuit 23a that generates a current corresponding to the leak current $I_{LEAK}$ in the read current path CP and the leak current replica circuit 23b that corrects the source voltage of the transistor QN31 is connected to the input node In1 of the sense amplifier 60. That is, the leak current replica circuits 23a and 23b generate a current corresponding to the leak current $I_{LEAK}$ in the read current path CP on the drain side of the transistor QN31, and give a resistance value corresponding to the resistance value of the whole read current path CP to the source side of the transistor QN31. The replica current $I_{REP}$ corresponding to the replica current Imp added to the reference side is thus added to the constant current source PS1 on the cell side. In addition, the source voltages of the transistors QN2 and QN31 can be corrected, and data read in the memory device 10 can be performed more stably.

(D) According to this embodiment, the leak current replica circuits 23a, 23b, and 24 are provided in the peripheral circuits of the memory device 10. This obviates the necessity of changing the cell array 9 that is the core region of the memory device 10. It is therefore easy to, for example, change an existing circuit configuration to the feature of this embodiment. Additionally, the core region of the memory device 10 need not be expanded, and the entire area of the circuits can be suppressed to be small.

Second Embodiment

A memory device according to this embodiment will be described next with reference to FIGS. 5, 6, 7, 8, and 11. A memory device 20 according to this embodiment is different from the above embodiment in that a leak current replica circuit 34 serving as a replica circuit that generates a replica current $I_{REP}$ corresponding to a leak current $I_{LEAK}$ in a read current path CP generates, on the reference side, the replica current $I_{REP}$ proportional to the leak current $I_{LEAK}$ on the cell side.

(1) Example of Configuration of Circuits on Read Path

Figure 5:
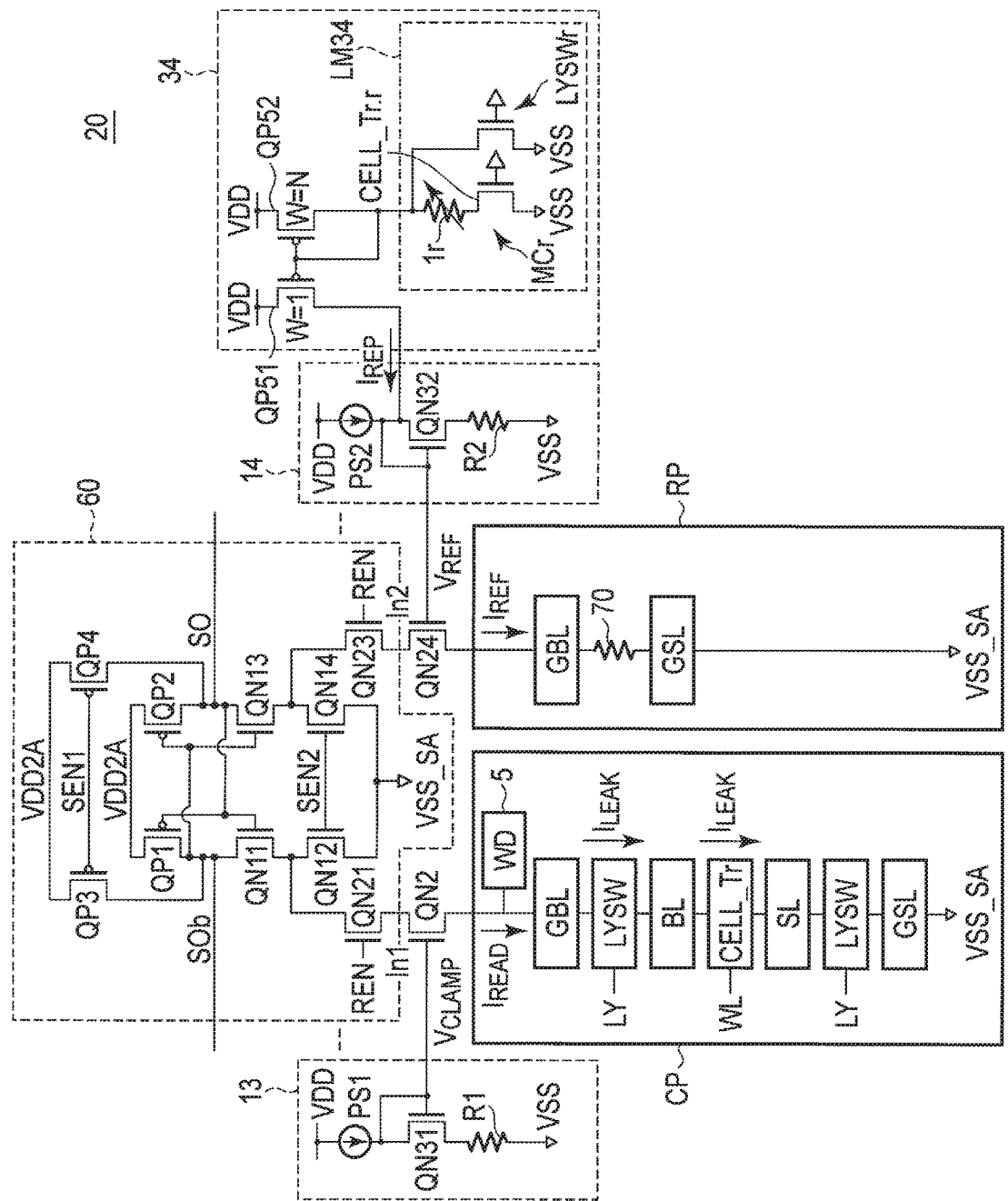
FIG. 5 is a block diagram schematically showing an example of the configuration of circuits on the read current path of a memory device according to the second embodiment.

FIG. 5 is a block diagram schematically showing an example of the configuration of circuits on the read path of the memory device 20 according to this embodiment. As shown in FIG. 5, the leak current replica circuit 34 is connected to a constant current generation circuit 14 of the memory device 20.

The leak current replica circuit 34 is connected to a transistor QN32 provided in the constant current generation circuit 14 in parallel with a constant current source PS2 of the constant current generation circuit 14.

The leak current replica circuit 34 has the same configuration as the leak current replica circuits 23a and 24. More specifically, the leak current replica circuit 34 includes transistors QP51 and QP52 that are p-type MOSFETs or the like. The transistors QP51 and QP52 correspond to the transistors QP41 and QP42 of the leak current replica circuit 24, respectively. However, the transistors QP51 and QP52 have, for example, different gate widths with respect to one another. The leak current replica circuit 34 includes a leak monitor circuit LM34 having the same configuration as the leak monitor circuit LM24. More specifically, the leak monitor circuit LM34 includes a replica MCr including a replica 1r and a replica CELL_Tr.r, and a replica LYSWr. The leak current replica circuit 34 is constituted as a 1:N current mirror circuit that returns the output on the side of the transistor QP52 to the side of the transistor QP51 1/N times larger. N is a value larger than 1.

To constitute the leak current replica circuit 34 as a 1:N current mirror circuit, for example, the transistors QP51 and QP52 are formed such that the transistor QP52 has a gate width W N times larger than that of the transistor QP51. Alternatively, the transistors QP51 and QP52 having the same gate width W may be formed, and the current value generated on the side of the transistor QP52 may be trimmed to 1/N by a trimming signal.

With the above feature, the leak current replica circuit 34 generates the replica current $I_{REP}$ that is proportional to the leak current $I_{LEAK}$ generated on the cell side and has a proportionality constant smaller than 1, that is, a proportionality constant of, for example, 1/N. A potential having a magnitude corresponding to the replica current $I_{REP}$ is added to a potential $V_{REF}$, and a reference current $I_{REF}$ corresponding to the potential $V_{REF}$ is input to, for example, an input node In2 as an input value. That is, since currents having substantially the same magnitude flow to the source sides of transistors QN24 and QN32 which form a current mirror circuit, the reference current $I_{REF}$ to which the replica current $I_{REP}$ having a magnitude 1/N times larger than the leak current $I_{LEAK}$ is added becomes the input value to a sense amplifier 60 at the input node In2.

As described above, the present inventors found that not all the leak current $I_{LEAK}$ generated in the read current path CP is reflected on a constant current source PS1 of a constant current generation circuit 13. Hence, the optimum value of the reference current $I_{REF}$ is not necessarily a value shifted by the leak current $I_{LEAK}$, and may be a shifted value obtained by multiplying the leak current $I_{LEAK}$ by a specific proportionality constant smaller than 1. The present inventors considered adjusting the replica current $I_{REP}$ on the reference side so as to obtain the optimum reference current $I_{REF}$ according to the change amount of the leak current $I_{LEAK}$. More specifically, the replica current $I_{REP}$ is caused to have a value equal to the product of the leak current $I_{LEAK}$ and a proportionality constant smaller than 1, like the change amount of the optimum reference current $I_{REF}$. An example of a circuit that realizes this concept is the above-described circuit configuration. The proportionality constant of the replica current $I_{REP}$ proportional to the leak current $I_{LEAK}$ is decided by, for example, acquiring data as shown in FIGS. 6 and 7 in advance for a memory cell MC.

Figure 6:
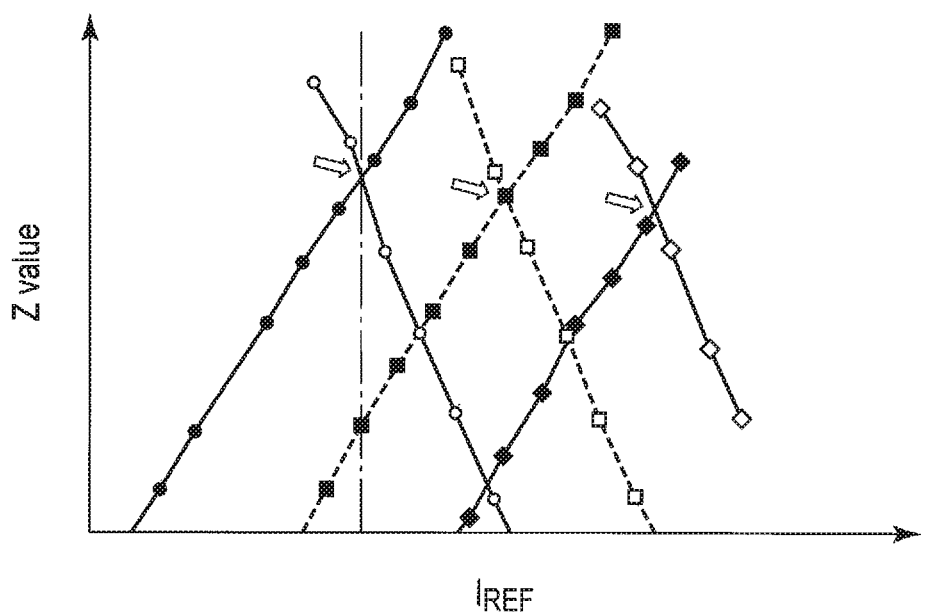
FIG. 6 is a graph showing the dependence of the optimum value of a reference current on a leak current using a Z value as an index.
Figure 7:
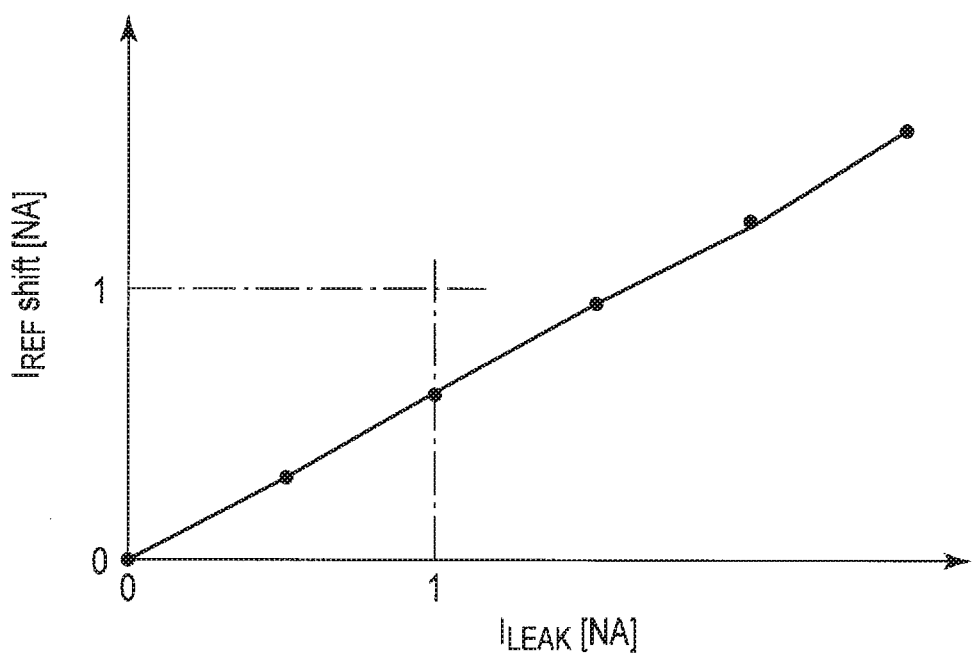
FIG. 7 is a graph showing the transition of the change amount of the optimum value of the reference current when the leak current changes.

FIG. 6 is a graph showing the dependence of the optimum value of the reference current $I_{REF}$ on the leak current $I_{LEAK}$ using a Z value as an index. The abscissa of the graph represents the reference current $I_{REF}$, and the ordinate represents the Z value.

In this graph, ● and ○ indicate the plots of Z values when the reference current $I_{REF}$ is changed in a memory cell in a high resistance state (●) and a memory cell in a low resistance state (○) in a state in which no leak current $I_{LEAK}$ is generated. In this graph, ■ and □ indicate the plots of Z values when the reference current $I_{REF}$ is changed in a memory cell in a high resistance state (■) and a memory cell in a low resistance state (□) in a state in which the specific leak current $I_{LEAK}$ is generated. In this graph, ◆ and ◇ indicate the plots of Z values when the reference current $I_{REF}$ is changed in a memory cell in a high resistance state (◆) and a memory cell in a low resistance state (◇) in a state in which the leak current $I_{LEAK}$ twice larger than that for the plots of ■ and □ is generated.

As shown in FIG. 6, in any of the plots, in the memory cell in the high resistance state, the Z value becomes large as the reference current $I_{REF}$ increases. In the memory cell in the low resistance state, the Z value becomes large as the reference current $I_{REF}$ decreases. Hence, the optimum values of the reference current $I_{REF}$ are the values at the intersections between the plots in the high resistance state and those in the low resistance state (the intersection between the plots of ● and ○, the intersection between the plots of ■ and □, and the intersection between the plots of ◆ and ◇ indicated by the arrows in the graph).

As described above, according to the present inventors, the result of FIG. 6 may indicate that the change amount of the leak current $I_{LEAK}$ and the change amount of the optimum value of the reference current $I_{REF}$ do not have a one-to-one correspondence. The proportionality constant of the reference current $I_{REF}$ with respect to the leak current $I_{LEAK}$ at this time is obtained as in the graph of FIG. 7 by, for example, experiments.

FIG. 7 shows the transition of the change amount of the optimum value of the reference current $I_{REF}$ ($I_{REF}$ Shift) when the leak current $I_{LEAK}$ changes. According to FIG. 7, the change amount of the reference current $I_{REF}$ is proportional to the leak current $I_{LEAK}$ generated on the cell side, and has a proportionality constant smaller than 1. In other words, the change amount of the reference current $I_{REF}$ (NA: arbitrary unit) when the leak current $I_{LEAK}$ is 1 (NA: arbitrary unit) can be used as the proportionality constant of the reference current $I_{REF}$ with respect to the leak current $I_{LEAK}$. The proportionality constant of the replica current $I_{REP}$ is the above-described proportionality constant of the reference current $I_{REF}$ itself. The above-described 1/N given by the leak current replica circuit 34 is an example of the thus obtained proportionality constant of the replica current $I_{REP}$.

(2) Effects of this Embodiment

According to this embodiment, the constant current generation circuit 14 that is provided with the leak current replica circuit 34 and generates the replica current $I_{REP}$ that is proportional to the leak current $I_{LEAK}$ in the read current path CP and has a proportionality constant smaller than 1 is connected to the input node In2 of the sense amplifier 60. The change amount of the reference current $I_{REF}$ that changes in accordance with the state of the memory cell MC has a value that is proportional to the leak current $I_{LEAK}$ in the read current path CP and has a proportionality constant smaller than 1. With at least one of the above-described features, one or a plurality of effects to be described below can be obtained in addition to the effects of the above embodiment.

(A) According to the feature of this embodiment, it is possible to further improve data read reliability in the memory device 10.

As shown in FIGS. 6 and 7 described above, the optimum value of the reference current $I_{REF}$ is not necessarily a value shifted by the leak current $I_{LEAK}$, and may be a shifted value obtained by multiplying the leak current $I_{LEAK}$ by a specific proportionality constant smaller than 1. In such a case, a more appropriate reference current $I_{REF}$ can be obtained by using the replica current $I_{REP}$ proportional to the leak current $I_{LEAK}$ based on the specific proportionality constant. In this case, a read current $I_{READ}$ and the reference current $I_{REF}$ hold a relationship as indicated by, for example, the lowermost graph (2nd Embodiment) of FIG. 11. That is, overlap of distributions $D_H$ and $D_L$ of the read current $I_{READ}$ and a distribution Do of the reference current $I_{REF}$ can further be suppressed using the more appropriate reference current $I_{REF}$. It is therefore possible to more correctly read data of the memory cell MC.

Figure 8:
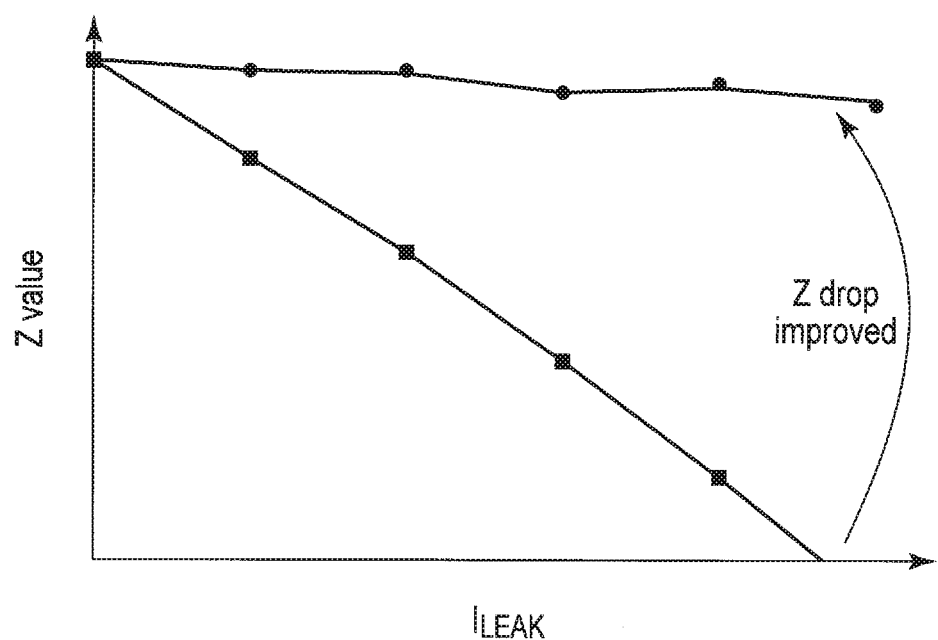
FIG. 8 is a graph showing changes in the Z value upon generating the leak current in the memory devices according to the second embodiment and a comparative example.

In the feature according to this embodiment as well, the data read reliability can be evaluated using the Z value as an index. FIG. 8 is a graph showing changes in the Z value upon generating the leak current $I_{LEAK}$. In this graph, ● indicates the plot of Z values when the leak current $I_{LEAK}$ is changed in a case where the reference current $I_{REF}$ of this embodiment is applied. In this graph, ■ indicates the plot of Z values when the leak current $I_{LEAK}$ is changed in a case where the reference current $I_{REF}$ does not change and maintains the optimum value for the leak current $I_{LEAK}$ of 0. As is apparent from FIG. 8, when the reference current $I_{REF}$ maintains the optimum value for the leak current $I_{LEAK}$ of 0, the Z value abruptly decreases as the leak current $I_{LEAK}$ increases. On the other hand, when the replica current $I_{REP}$ having a specific proportionality constant smaller than 1 is added to the reference current IRE, as in this embodiment, the decrease in the Z value can be suppressed to be very small.

The same can be said of FIG. 6 described above. Consider a case (for example, the plot of ■ in FIG. 6) where the specific leak current $I_{LEAK}$ is generated while maintaining the optimum value (the intersection between the plots of ● and ○ in FIG. 6) of the reference current IRE for the leak current $I_{LEAK}$ of 0. The Z value abruptly decreases from the value at the intersection between the plots of ● and ○ to the value at the intersection between the plot of ■ and the alternate long and short dashed line vertically extending from the intersection position. On the other hand, when the reference current $I_{REF}$ is changed, the Z value almost maintains the level for the leak current $I_{LEAK}$ of 0, although a slight decrease is observed in the transition of the Z value from the intersection between the plots of ● and ○ to the intersection between the plots of ■ and □ and to the intersection between the plots of ♦ and ◇.

According to the feature of this embodiment, it is possible to further suppress an abrupt decrease (Z Drop) in the Z value caused by an increase in the leak current $I_{LEAK}$.

(B) According to the feature of this embodiment, it is only necessary to connect the leak current replica circuit 34 to the constant current generation circuit 14, and the memory device 20 can be formed more easily.

Other Embodiments

Figure 9:
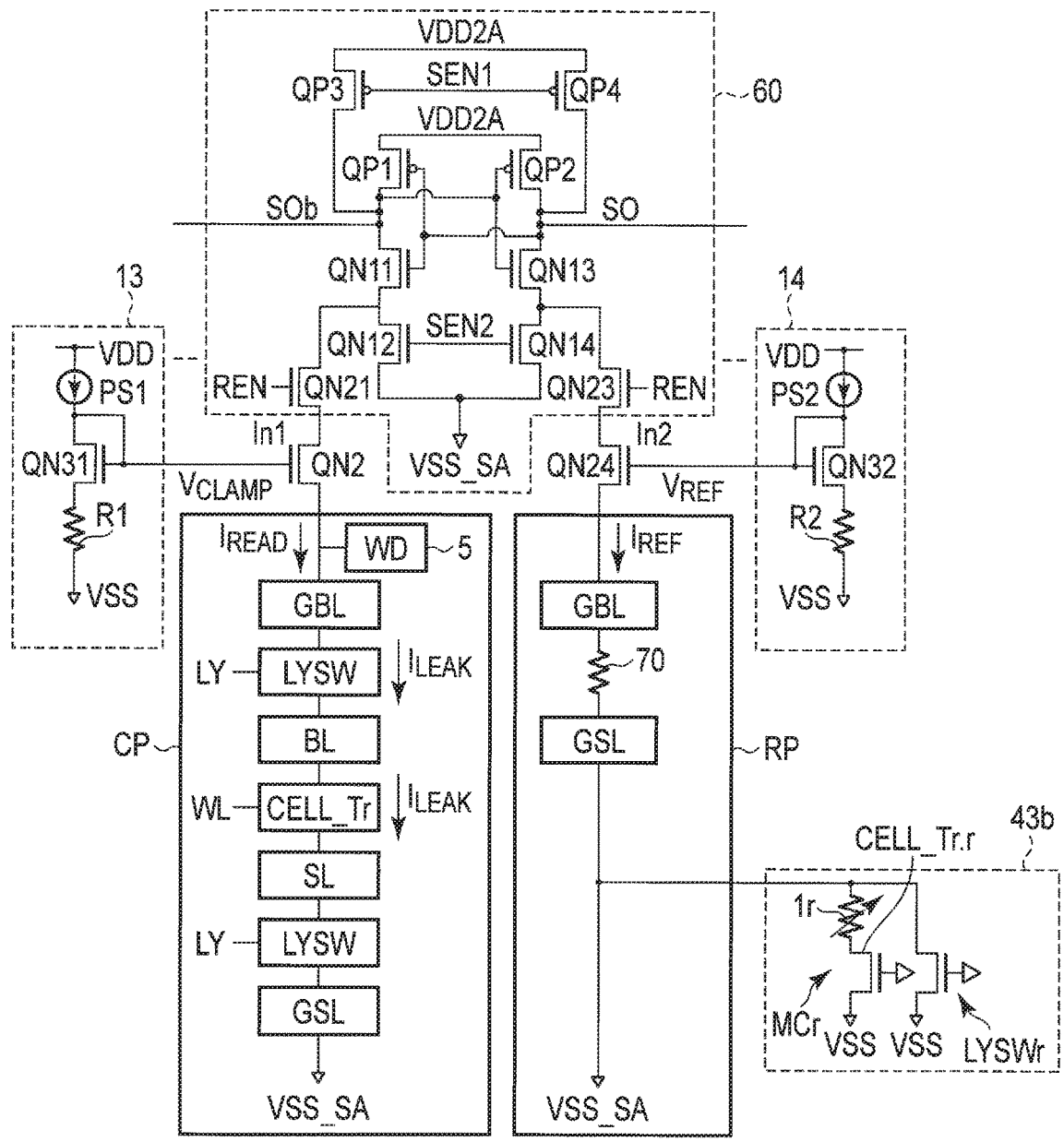
FIG. 9 is a block diagram schematically showing an example of the configuration of circuits on the read current path of a memory device according to another embodiment.

In the above embodiments, novel components such as the leak current replica circuits 23a, 23b, 24, and 34 are provided in the peripheral circuits of the memory device 10 or 20. However, the present invention is not limited to this. For example, as shown in FIG. 9, a leak current replica circuit 43b may be provided in the core circuit, for example, between the ground node VSS_SA and the global source line GSL of the reference current path RP. The leak current replica circuit 43b can have the same configuration as that of, for example, the above-described leak current replica circuit 23b.

In the above embodiments, the constant current generation circuit 14 including the constant current source PS2 is used as a circuit contributing to generation of the reference current $I_{REF}$. However, the present invention is not limited to this. A current generation circuit including a current source configured to linearly change the reference current in accordance with the temperature state of a memory cell may be used. Use of this current generation circuit makes it possible to cope with, for example, a change in the resistance value of the read target memory cell itself according to the temperature state. When the feature of this embodiment is applied to the current generation circuit, a more appropriate reference current can be generated. This matter also can be applied to the constant current source PS1 provided in the constant current generation circuit 13.

In the above embodiments, a resistance change memory element is used in the memory cell MC. However, the present invention is not limited to this. For example, an element used in a ReRAM (Resistive Random Access Memory) or an element used in a PRAM or PCRAM (Phase Change Random Access Memory) is usable in the memory cell.

Figure 10:
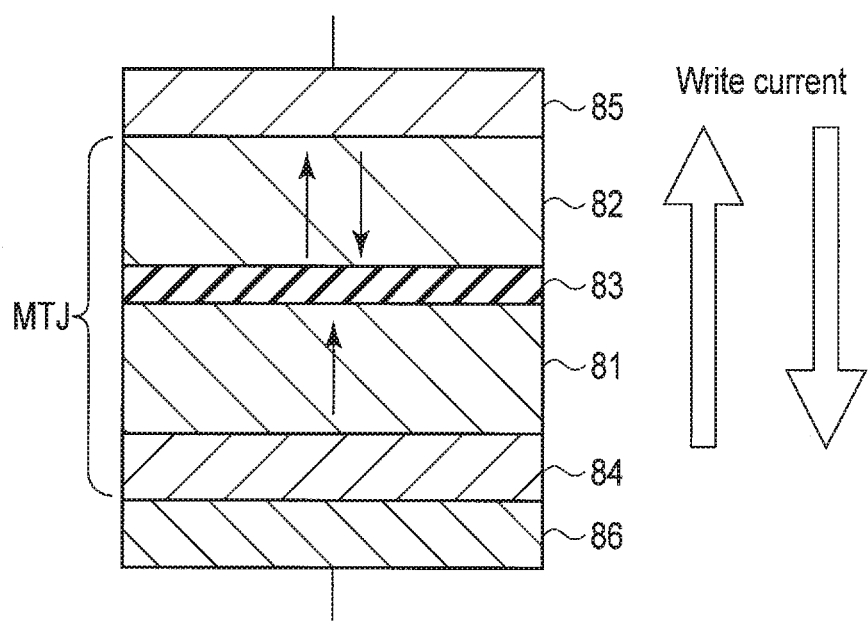
FIG. 10 is a sectional view showing an example of a memory element provided in a memory device.

As an example of a resistance change memory element used in an MRAM (Magnetoresistive Random Access Memory), FIG. 10 shows an example of the structure of an MTJ (Magnetic Tunnel Junction) element serving as a magnetoresistive element.

The MTJ element is configured to attain a steady resistance state that changes depending on the direction of a current flowing through the element. The phenomenon that a different resistance is exhibited depending on the state is called a magnetoresistance effect, and the MTJ element holds data by using this phenomenon. As shown in FIG. 10, an MTJ (Magnetic Tunnel Junction) of the MTJ element includes at least a fixed layer 81, a recording layer 82, and an insulating layer 83 between them. The magnetization of the fixed layer 81 is fixed by an antiferromagnetic layer 84. The recording layer 82 has a magnetization that changes in accordance with the direction of a write current flowing through the layer. The MTJ element exhibits a different resistance state depending on the relative relationship between the magnetization direction of the fixed layer 81 and that of the recording layer 82. The plurality of different resistance states are associated with, for example, two values of 1-bit data, respectively. Electrode layers 85 and 86 are provided to sandwich the MTJ element.

Note that according to all above embodiments, the applied memory device (MRAM as described above) may be a spin-transfer torque magnetoresistive random access memory (STT-MRAM) utilizing spin transfer torque phenomenon for magnetization reversal of a magnetic layer.

In each of the above embodiments, as a memory device, an MRAM using a magnetoresistive effect element as a variable resistance element is explained as an example, but is not limited thereto. The embodiments can be applied to various types of semiconductor memory device for storing (or holding) or reading the data using the memory element which varies its resistance value by applying a necessary current or voltage. The embodiments can be applied to a resistance change type memory similar to an MRAM, such as a ReRAM (resistive random access memory) and a PCRAM (phase-change random access memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
a sense amplifier including a first input node and a second input node and configured to output a signal based on a difference between input values at the first input node and the second input node;
a first path including a memory cell to be selectively connected to the first input node and provided between the first input node and a ground node; and
a second path including a reference cell to be selectively connected to the second input node and provided between the second input node and the ground node,
wherein the input value at the second input node of the sense amplifier is changed such that a change amount of an input value between two different temperatures T2 and (T2+ΔT) in a second temperature region, at a temperature higher than in a first temperature region, of the memory cell becomes larger than a change amount of an input value between two different temperatures T1 and (T1+ΔT) in the first temperature region of the memory cell,
where ΔT is an increase amount of the temperature.

2. The memory device according to claim 1, wherein the change amount of the input value at the second input node is proportional to a leak current in the first path and has a proportionality constant smaller than 1.

3. The memory device according to claim 1, wherein a reference current generation circuit provided with a replica circuit is connected to the second input node of the sense amplifier.

4. The memory device according to claim 3, wherein the replica circuit comprises a leak monitor circuit configured to monitor a leak current in the first path.

5. The memory device according to claim 4, wherein the leak monitor circuit comprises a replica of the memory cell.

6. The memory device according to claim 4, wherein the leak monitor circuit comprises a replica of a local column switch configured to select or unselect the memory cell.

7. The memory device according to claim 1, wherein a current generation circuit provided with a replica circuit is connected to the first input node of the sense amplifier.

8. The memory device according to claim 1, wherein the memory cell comprises a resistance change memory element as a memory element.

9. The memory device according to claim 1, wherein the memory cell comprises a magnetoresistive element as a memory element.

* * * * *